United States Patent [19]

Ohsawa et al.

[11] Patent Number: 6,054,773
[45] Date of Patent: Apr. 25, 2000

[54] SEMICONDUCTOR DEVICE AND METHOD OF MANUFACTURING THE SAME

[75] Inventors: Kenji Ohsawa; Kazuhiro Sato; Hiroyuki Shigeta, all of Kanagawa, Japan

[73] Assignee: Sony Corporation, Tokyo, Japan

[21] Appl. No.: 09/048,843

[22] Filed: Mar. 27, 1998

[30] Foreign Application Priority Data

Mar. 28, 1997 [JP] Japan ................................. 9-077194
Jul. 10, 1997 [JP] Japan ................................. 9-185092

[51] Int. Cl.[7] ........................... H01L 23/48; H01L 23/52; H01L 29/40
[52] U.S. Cl. ............................................. 257/783; 257/781
[58] Field of Search ................................. 257/698, 782, 257/783, 780, 781, 758, 692, 693, 778

[56] References Cited

U.S. PATENT DOCUMENTS

| | | |
|---|---|---|
| 4,907,061 | 3/1990 | Kohara . |
| 5,523,622 | 6/1996 | Harada et al. . |
| 5,604,379 | 2/1997 | Mori . |
| 5,892,271 | 4/1999 | Takeda et al. . |
| 5,895,965 | 4/1999 | Tanaka et al. . |

FOREIGN PATENT DOCUMENTS

| | | |
|---|---|---|
| 60-178704 | 9/1985 | Japan . |
| 1-155633 | 6/1989 | Japan . |

*Primary Examiner*—Sheila V. Clark
*Attorney, Agent, or Firm*—Hill & Simpson

[57] ABSTRACT

An adhesive sheet which has rigidity and a portion which adheres to the back surface of the outside portion of the film circuit is used. Specifically, there is used the adhesive sheet which is obtained by forming cushioning adhesive sheet layers on both the surfaces of the rigid sheet layer formed of stainless or the like. Further, the rigid sheet layer is also used for electrostatic shield. The co-planarity of external terminals (soldering balls) is enhanced without vainly increasing the weight of a semiconductor device, and further the resistance to high-frequency noses in the semiconductor device is enhanced.

8 Claims, 10 Drawing Sheets

PRINTED CIRCUIT BOARD

SEMICONDUCTOR DEVICE

PRINTED CIRCUIT BOARD

ELECTRODES ON PRINTED CIRCUIT BOARD

SEMICONDUCTOR DEVICE AND METHOD OF MANUFACTURING THE SAME

BACKGROUND OF THE INVENTION

The present invention relates to a semiconductor device, particularly a semiconductor device including: at least a film circuit which is manufactured by forming plural leads on an insulating layer serving as a base, setting one ends of the leads as semiconductor element side terminals to be connected to the electrodes of a semiconductor element and forming external terminals at the other ends of the leads, whereby the film circuit is provided with a element facing portion and an outside portion at the outside of the element facing portion; and a semiconductor element in which the respective electrodes are connected to the semiconductor element side terminals of the leads, and the surface of the semiconductor element is adhesively attached to the back surface of the element facing portion through an adhesive sheet, the gap between the film circuit and the semiconductor element being sealed, and a method of manufacturing the semiconductor device.

There have been developed various semiconductor devices in which each electrode of a semiconductor element is bonded to the tip of each lead of a film circuit, and the gap between the semiconductor element and the film circuit is sealed with resin, and FIGS. 1A and 1B show one of developed semiconductor devices, wherein FIG. 1A is a plan view and FIG. 1B is a cross-sectional view.

In FIGS. 1A and 1B, a represents a film circuit comprising a base b formed of polyimide tape or the like and leads c formed on the back surface of the base b, and the film circuit a has an element facing portion which is disposed so as to face a semiconductor element g as described later, and an outside portion e located at the outside of the element facing portion. f represents each soldering ball which is bonded to one end of each lead c, and it constitutes an external terminal of the semiconductor device.

g represents a semiconductor element, and each electrode thereof is bonded to a terminal of each lead c at the opposite side to the soldering ball side. h represents a cushioning adhesive sheet for adhesively attaching the back surface of the element facing portion d of the film circuit a and the surface of the semiconductor element g, and m represents a slit of the sheet h. i represents a ring of metal (copper, for example) which is connected to the lower surface of the peripheral edge portion of the outside portion e of the film circuit a, and it serves as an enforcing plate. If occasion demands, the ring is grounded to have an electrostatic shield effect, and thus it also serves to enhance resistance to noises. j represents resin which is filled to seal the gap between the film circuit a and the semiconductor device g.

The film circuit a having the element facing portion d and the outside portion (a portion which extends outwardly substantially from the semiconductor element, viewed from the lower side) e is used because the integration density of the semiconductor element g is enhanced and the number of electrodes is increased more remarkably as compared with the size thereof.

FIG. 2 is a cross-sectional view showing another developed semiconductor device. In this case, the semiconductor element g and the outside portion e of the film circuit a are supported by using a supporter k which is formed of metal such as aluminum or the like, or other materials. l represents an adhesive member for adhesively attaching the supporter k and the outside portion e. The supporter k formed of metal or the like is used to prevent the film circuit a from slacking at the peripheral edge portion.

The case shown in FIG. 1 has such a problem that the film circuit a slacks, sags or droops at the outside portion e thereof. The reason is as follows. Since the base of the film circuit a is formed of a resin tape of polyimide or the like which has a thickness of about several tens microns, the outside portion e thereof is liable to be bent due to the dead weight thereof and thus it is liable to be sealed by resin j in this state. If the film circuit a is sealed while it is bent (slacks), the soldering balls f are not uniform in height. Specifically, the soldering balls f at the outside portion e are lower in height than the soldering balls f at the element facing portion d. This problem, that is, the problem that so-called co-planarity of the soldering balls lacks necessarily disturbs a semiconductor device from being excellently mounted on a print board or the like, and thus this problem cannot be neglected.

The semiconductor device shown in FIG. 2 has been developed in order to avoid the above "co-planarity problem". In the semiconductor device, the semiconductor element g and the outside portion e of the film circuit a are firmly supported by the supporter k of metal of aluminum or the like.

Accordingly, it has been expected that the slacking, sagging and drooping at the outside portion e can be prevented. However, it is the actual situation that the expectation cannot be perfectly satisfied. This is because it is difficult to sufficiently enhance the precision in the positional relationship between the outer shape of the supporter k and each soldering ball f due to the restriction in enhancement of processing precision of the supporter k of metal such as aluminum or the like and thus it is difficult to make the co-planarity perfect.

However, it has a disadvantage that when the support k formed of metal is used, it induces such a risk that the weight of the semiconductor device itself is increased and a requirement of reducing the weight of electrical equipment using the semiconductor device cannot be satisfied. Therefore, it is not necessarily better to use the semiconductor device shown in FIG. 2.

SUMMARY OF THE INVENTION

The present invention has been made in order to solve these problems, and has an object to improve the co-planarity of external terminals without increasing the weight of a semiconductor device and further enhance the resistance to high-frequency noses in the semiconductor device in a semiconductor device including: at least a film circuit which is manufactured by forming plural leads on an insulating layer serving as a base, setting one ends of the leads as semiconductor element side terminals to be connected to the electrodes of a semiconductor element and forming external terminals at the other ends of the leads, whereby the film circuit is provided with a element facing portion and an outside portion at the outside of the element facing portion; and a semiconductor element in which the respective electrodes are connected to the semiconductor element side terminals of the leads, and the surface of the semiconductor element is adhesively attached to the back surface of the element facing portion through an adhesive sheet, the gap between the film circuit and the semiconductor element being sealed.

The present invention has another object to reduce the number of steps in a process of manufacturing the semiconductor device as described above, thereby reducing the manufacturing cost of the semiconductor device.

In order to attain the above objects, a semiconductor device according to a first aspect of the present invention is characterized by including an adhesive sheet which has rigidity and a portion to be adhesively attached to the back surface of the outside portion of the film circuit.

Accordingly, according to the semiconductor device of the first aspect of the present invention, the slacking or drooping of the film circuit, particularly the slacking or sagging of the film circuit at the outside portion thereof can be prevented by the rigidity of the adhesive sheet.

When the adhesive sheet has such a multilayer structure that a cushioning sheet layer and a rigid sheet layer are laminated on each other and the rigid sheet layer is designed to have conductivity and be grounded, the surface portion of the semiconductor element and the outside thereof are electrostatically intercepted through the rigid sheet layer, that is, electrostatic shield can be achieved. Accordingly, the resistance to high-frequency noises can be enhanced.

Further, when an earth-connecting lead is formed on the film circuit and the rigid sheet layer having conductivity is connected to the earth connecting lead, the grounding can be established with a simple structure, and thus the grounding can be established more stably.

A method of manufacturing a semiconductor device according to a second aspect of the present invention is characterized in that each lead of a film circuit is connected to each electrode of a semiconductor element, and at the same time a earth connecting lead of the film circuit is connected to a rigid sheet layer of an adhesive sheet.

Accordingly, according to the semiconductor device manufacturing method of the present invention, the step of connecting the electrodes of the semiconductor element and the earth connecting step of the film circuit can be performed by only one step, so that the number of steps can be reduced and the cost can be reduced.

BRIEF DESCRIPTION OF THE DRAWINGS

FIGS. 1A and 1B show a conventional developed semiconductor device, wherein FIG. 1A is a plan view of the semiconductor device and FIG. 1B is a cross-sectional view of the semiconductor device;

FIGS. 3A and 3B show a first embodiment of a semiconductor device according to the present invention, wherein FIG. 3A is a plan view of the semiconductor device and FIG. 3B is a cross-sectional view of the semiconductor device;

FIGS. 4A and 4B show a cushioning adhesive sheet used in the first embodiment, wherein FIG. 4A is a cross-sectional view of the cushioning adhesive sheet and FIG. 4B is a plan view of the cushioning adhesive sheet;

FIGS. 7A and 7B show a manufacturing method of the third embodiment, wherein FIG. 7A is a plan view and FIG. 7B is a cross-sectional view;

FIGS. 10A and 10B show the manufacturing method of the third embodiment, wherein FIG. 10A is a plan view and FIG. 10B is a cross-sectional view; and FIGS. 11A and 11B show a case where the semiconductor device shown in FIG. 3B is mounted in electrical equipment such as a portable telephone or the like.

DETAILED DESCRIPTION OF THE PREFERRED EMBODIMENTS

Preferred embodiments according to the present invention will be described hereunder with reference to the accompanying drawings.

In a semiconductor device including: at least a film circuit which is manufactured by forming plural leads on an insulating layer serving as a base, setting one ends of the leads as semiconductor element side terminals to be connected to the electrodes of a semiconductor element and forming external terminals at the other ends of the leads, whereby the film circuit is provided with a element facing portion and an outside portion at the outside of the element facing portion; and a semiconductor element in which the respective electrodes are connected to the semiconductor element side terminals of the leads, and the surface of the semiconductor element is adhesively attached to the back surface of the element facing portion through an adhesive sheet, the gap between the film circuit and the semiconductor element being sealed, an adhesive sheet which has rigidity and is provided with a portion to be adhesively attached to the back surface of the outside portion of the film circuit is used.

It is preferable to use the adhesive sheet having such a multilayer structure that a cushioning sheet layer and a rigid sheet layer are laminated, and also to use the rigid sheet layer which has conductivity and is grounded. The rigid sheet layer is not limited to the metal plate insofar as it has rigidity and conductivity.

In the semiconductor device manufacturing method of the present invention, there is prepared a film circuit which is formed by forming the plural leads containing the earth connecting leads with the insulating layer such as polyimide tape being used as a base, setting one ends of the leads as semiconductor element side terminals to be connected to the electrodes of the semiconductor element, and forming the external terminals such as the soldering balls at the other ends to thereby provide the film circuit with the element facing portion and the outside portion at the outside of the element facing portion; then the surface of the semiconductor element is adhesively attached to the back surface of the element facing portion of the film circuit through the adhesive sheet comprising the cushioning sheet layer and the rigid sheet layer which are laminated on each other, and then by one bonding step the lead of the film circuit is connected to each electrode of the semiconductor element and at the same time the earth connecting lead of the film circuit is connected to the rigid sheet layer of the adhesive sheet.

[Embodiments]

The present invention will be described in detail on the basis of preferred embodiments shown in the figures.

Figure 1A:
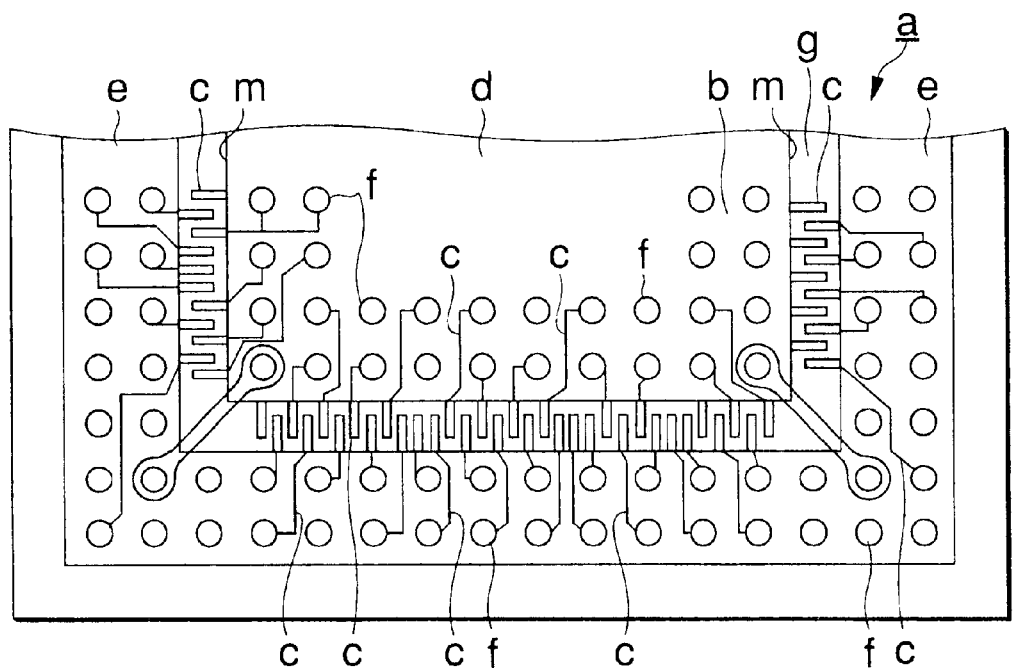
Figure 1B:
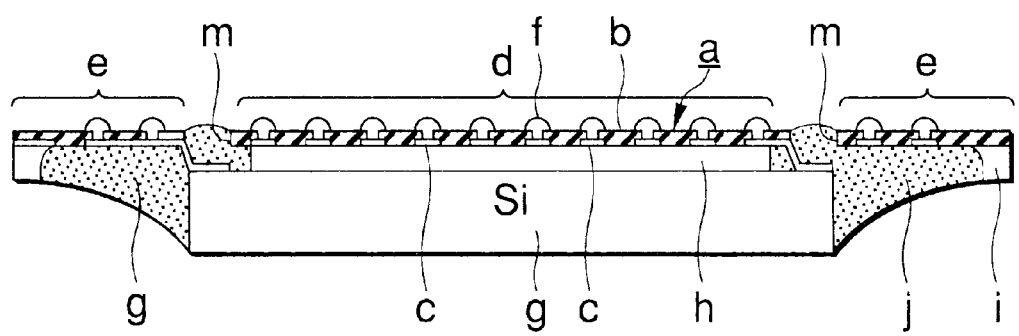
Figure 2:
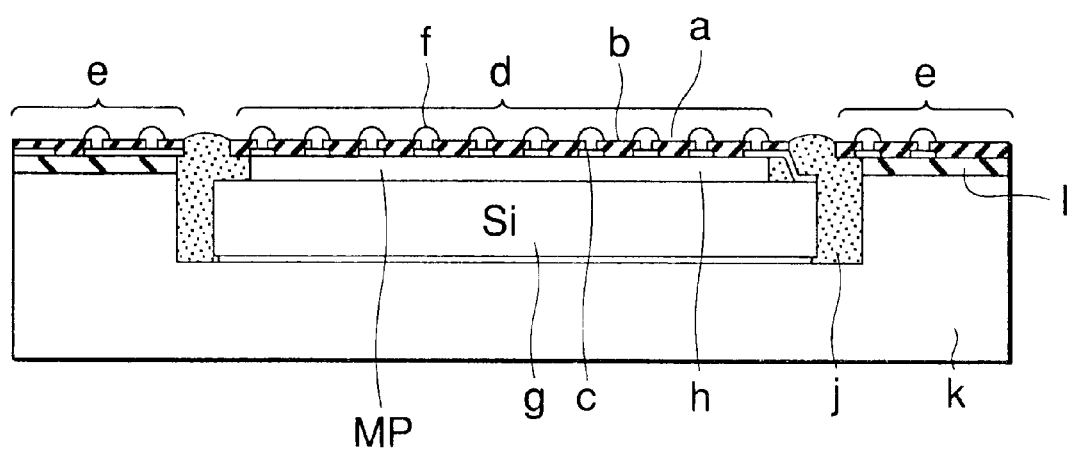
FIG. 2 is a cross-sectional view showing another developed semiconductor device.
Figure 3A:
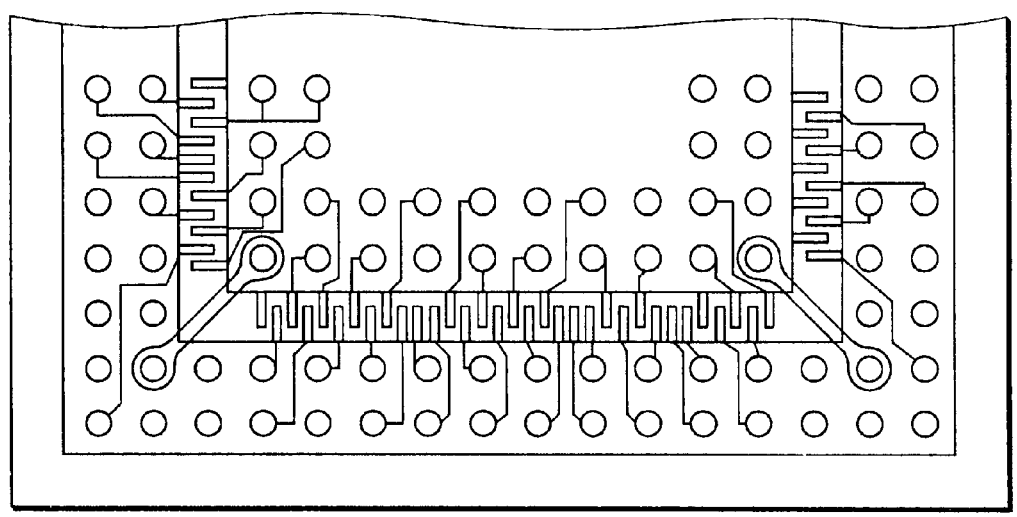
Figure 3B:
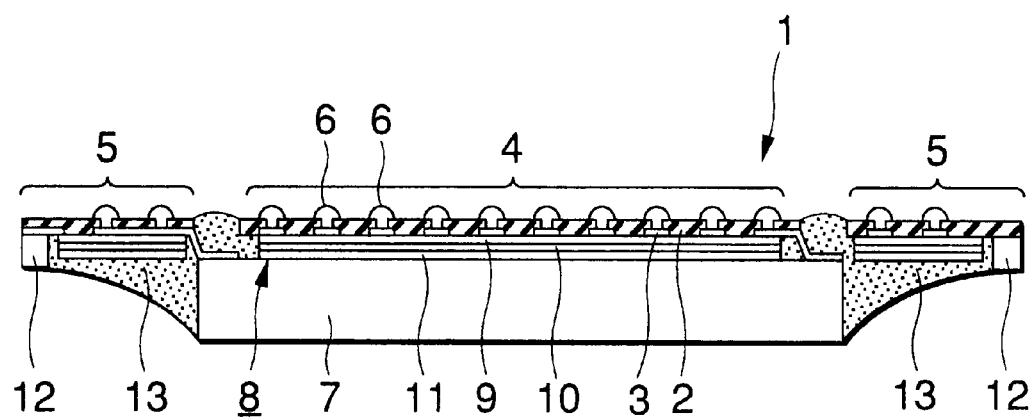
Figure 4A:
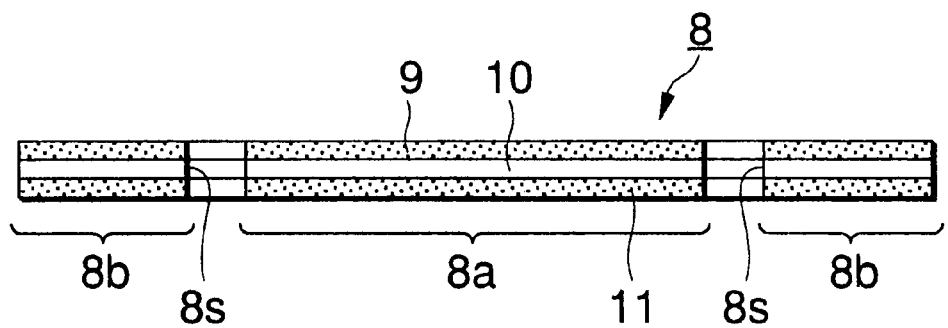
Figure 4B:
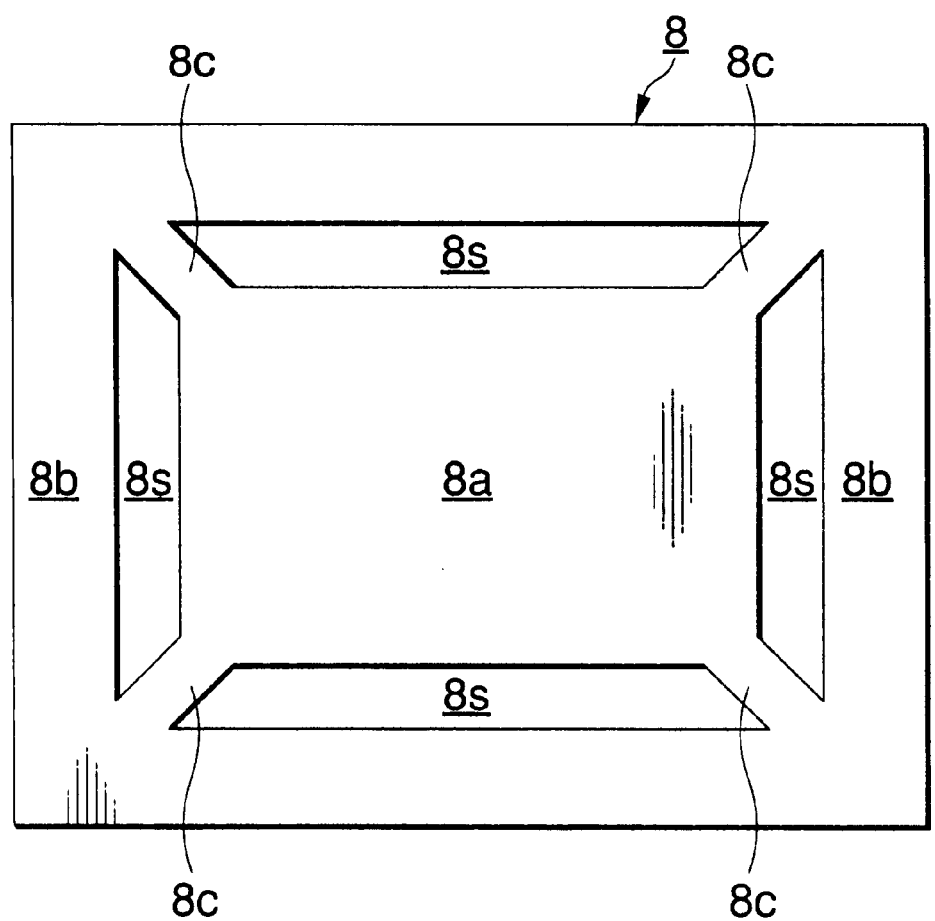

FIGS. 3A, 3B and FIGS. 4A, 4B show a first embodiment of a semiconductor device according to the present invention. FIG. 3A is a plan view of the first embodiment of the semiconductor device, FIG. 3B is a cross-sectional view showing the first embodiment of the semiconductor device, FIG. 4A is a cross-sectional view showing an adhesive sheet being used, and FIG. 4B is a plan view showing the adhesive sheet being used.

In the FIGS. 3A to 4B, reference numeral 1 represents a film circuit. The film circuit 1 is constructed by forming leads 3 on the back surface of a base 2 comprising a polyimide tape or the like and has an element facing portion 4 which is provided so as to face a semiconductor element 7 as described later, and an outside portion 5 located at the outside thereof. Reference numeral 6 represents a soldering ball connected to one end of each lead 3, and it constitutes an external terminal of the semiconductor device. Reference numeral 12 represents an enforcing ring which is formed on the lower surface of the peripheral edge portion of the outside portion 5 of the film circuit 1, and it is formed of copper, for example. Therefore, the enforcing ring is grounded and thus serve as an electrostatic shield due to its conductivity. Specifically, the enforcing ring 12 forms an earth line of the film circuit 1 or is connected to the plural leads 3.

Reference numeral 7 represents the semiconductor element, and each electrode thereof is bonded to the terminal of the opposite soldering ball side of each lead 3.

Reference numeral 8 represents an adhesive sheet for adhesively attaching the back surface of the element facing portion 4 of the film circuit 1 and the surface of the semiconductor element 7, and in this embodiment it has a three-layer structure as shown in FIG. 3B, FIG. 4A.

Reference numeral 9 represents a cushioning adhesive sheet layer constituting the uppermost layer of the adhesive sheet 8. It is formed of polyolefine-based adhesive sheet material, polyimide-based adhesive sheet material, epoxy-based adhesive sheet material or the like, and has a thickness of about 10 to 100 μm, for example, 50 μm.

Reference numeral 10 represents a rigid sheet layer constituting an intermediate layer of the adhesive sheet 8. It is formed of stainless (SUS304), phosphor bronze, 42ALLOY, ceramic sheet, glass epoxy, polyimide or the like and has a thickness of 30 to 100 μm, for example, 50 μm.

Reference numeral 11 represents a cushioning adhesive sheet layer serving as the lowermost layer of the adhesive sheet 8. It is formed of polyolefine-based adhesive sheet material, polyimide-based adhesive sheet material, epoxy-based adhesive sheet material or the like, and has a thickness of 10 to 100 μm, for example, 50 μm.

Reference numeral 8a represents a portion of the adhesive sheet 8 which corresponds to (faces) the semiconductor element 7 (element facing portion 4), reference numeral 8b represents a portion of the adhesive sheet 8 which corresponds to (faces) the outside portion of the semiconductor element 7, reference numeral 8s represents a slit disposed which are formed in the adhesive sheet 8 so as to be interposed between the portions 8a and 8b, and reference numeral 8c represents a linkage portion which integrally links the portions 8a and 8b to each other and is provided at each of four corners of the substantially rectangular adhesive sheet 8.

The film circuit 1 having the element facing portion 4 and the outside portion (the portion extending substantially from the portion corresponding to the semiconductor element 7 to the outside, viewed from the lower side) 5 is used in order to enhance the integration degree of the semiconductor element 7 and increase the number of electrodes as compared with the size of the semiconductor element 7.

In the adhesive sheet 8, the cushioning adhesive sheet layer 9 serving as the uppermost layer adheres to the back surface of the film circuit 1, and the portion 8a which is located inwardly from the slit 8a of the cushioning adhesive sheet layer 11 serving as the lowermost layer adheres to the surface of the semiconductor element 7.

The terminal at the semiconductor element side of each lead 3 of the film circuit 1 is bonded to each electrode of the semiconductor element 7.

Reference numeral 13 represents resin for sealing the gap between the film circuit 1 and the semiconductor element 7.

According to the present invention, the adhesive sheet 8 having the rigid sheet layer 10 as an intermediate layer is used, so that the film circuit 1, particularly the outside portion 4 thereof can be firmly supported by the rigidity of the adhesive sheet 8. Accordingly, the slacking or drooping of the film circuit 1, particularly the outside portion 4 thereof can be prevented.

Figure 5:
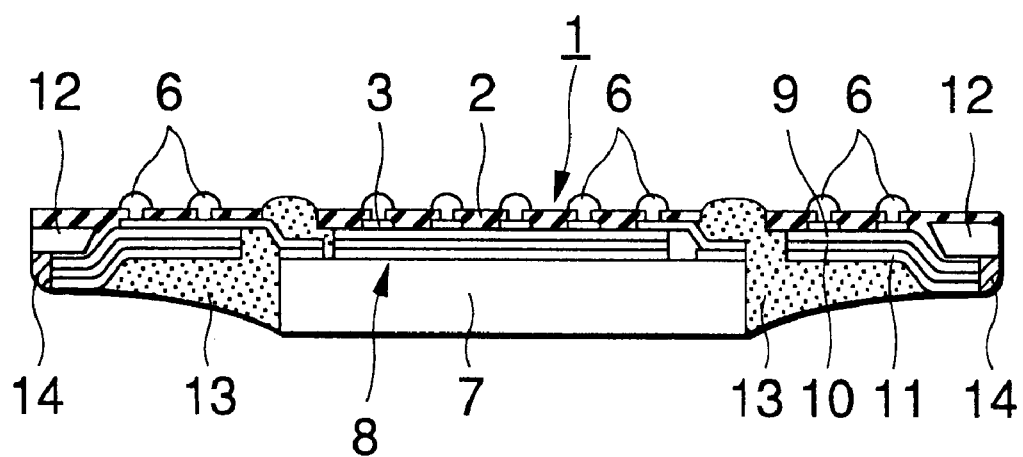
FIG. 5 is a cross-sectional view showing a second embodiment of the semiconductor device of the present invention.

FIG. 5 is a cross-sectional view showing a second embodiment of the semiconductor device. This embodiment is different from the first embodiment shown in FIGS. 3 and 4 only in that the rigid sheet layer 10 serving as the intermediate layer of the adhesive sheet 8 is also used for electrostatic shield. Therefore, only the difference will be described.

In this embodiment, the peripheral edge portion of the outside portion 8b of the adhesive sheet 8 is located below an enforcing ring 12 having conductivity such as copper or the like, and the edge of the outside portion 8b, particularly the edge of the rigid sheet layer 10 serving as the intermediate layer thereof is adhesively attached to the enforcing ring 12 thereof through a soldering paste layer 14. The edge of the rigid sheet layer 10 is first set co-planar with (located on the same plane as) the edges of the cushioning adhesive sheet layers 9 and 11 on both the principal planes of the rigid sheet layer 10. However, the sheet layers 9 and 11 at both the upper and lower surface sides are contracted through the thermal treatment for adhesion whereas the rigid sheet layer 10 is not contracted, and thus the edge of the rigid sheet layer 10 is surely exposed, so that it can be surely electrically connected to the reinforcing ring 12 through the soldering paste layer 14 and thus it can be allowed to be grounded.

Accordingly, the rigid sheet layer 10 electrically shields the integrated circuit in the semiconductor element 7 from the outside together with the reinforcing ring 12 to enhance the resistance to high frequency noises in the integrated circuit, and it greatly contributes to increase of the frequencies of electrical signals which are handled by the circuit.

It is needless to say that the second embodiment has the same effect as the first embodiment, that is, the effect that the slacking or sagging of the film circuit 1 can be prevented by the rigidity which is given to the adhesive sheet 8 by the rigid sheet layer 10.

Figure 6:
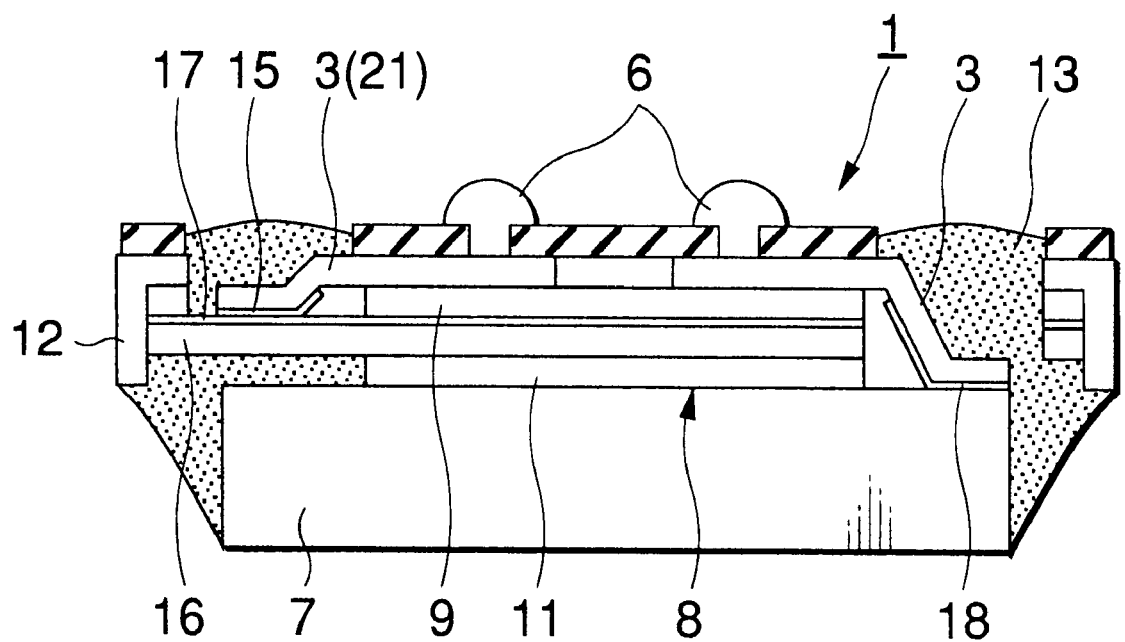
FIG. 6 is a cross-sectional view showing a third embodiment of the semiconductor device according to the present invention.

FIG. 6 is a cross-sectional view showing a third embodiment of the semiconductor device according to the present invention. This embodiment is relating to another case when the rigid sheet layer 10 serving as the intermediate layer of the adhesive sheet 8 is also used for electrostatic shield as in the case of the second embodiment shown in FIG. 5.

Figure 7A:
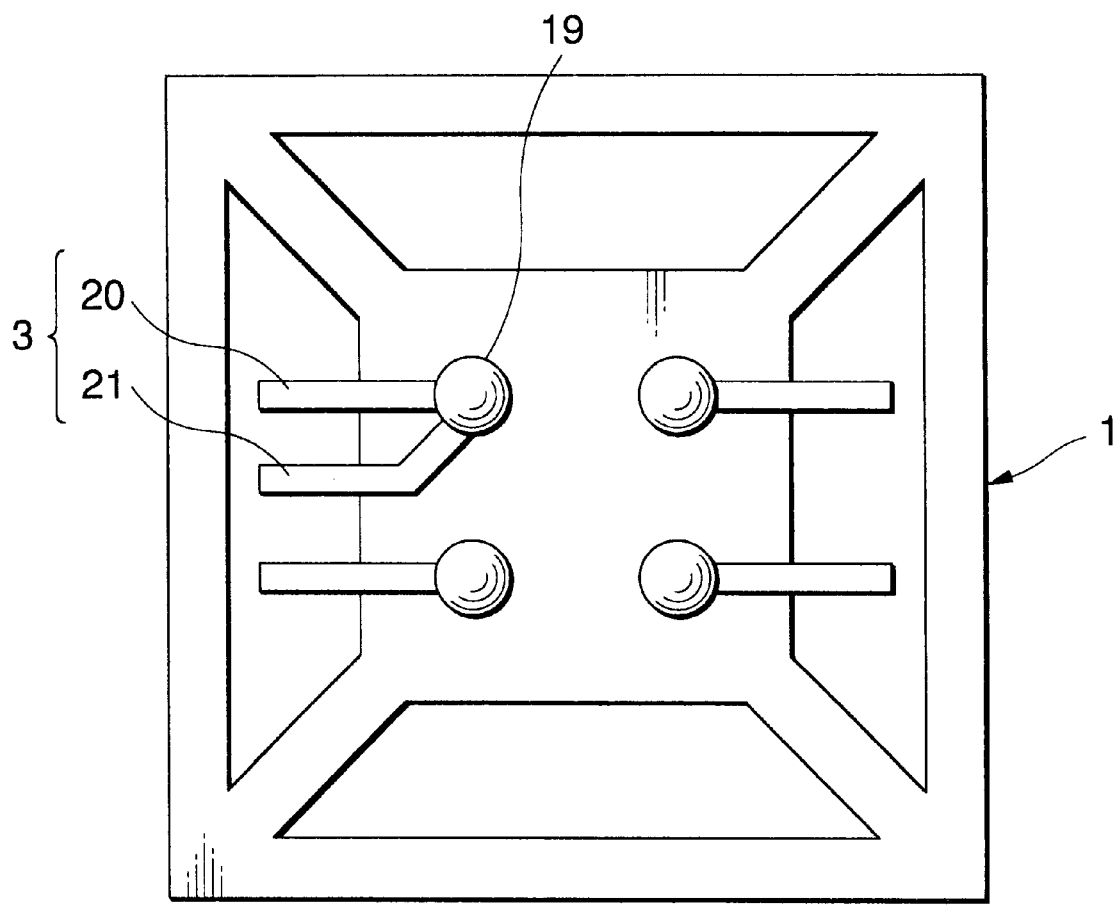
Figure 7B:
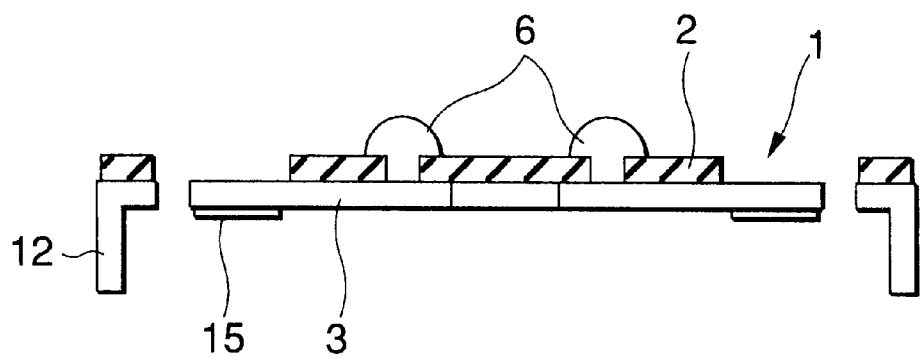

In this embodiment, a metal plate 16 having rigidity and conductivity such as stainless is used as the rigid sheet layer 10 of the adhesive sheet 8, and a high conductive layer 17 formed of aluminum, silver or the like is formed by a plating method, a deposition method or the like, for example. Element connecting leads 20 and earth connection leads are formed as the leads 3 of the film circuit 1, bumps 15 are formed at the tip portions of the respective leads 20, 21, and each of the leads 20, 21 is drawn from an earth terminal 19 as shown in FIGS. 7A and 7B. The earth connection leads 21 are connected to the high conductive layer 17 on the surface of the metal plate 16 serving as the rigid sheet layer 10, and the metal plate 16 is brought into contact with the reinforcing ring 12 to be grounded. Further, the leads 3 are connected to pad-shaped electrodes 18 on the surface of the semiconductor element 7.

Accordingly, according to the embodiment, the metal plate 16 is electrically connected to the reinforcing ring 12 without using the soldering paste 14 which is used in the second embodiment, thereby shielding the integrated circuit in the semiconductor element 7 from the outside, so that the ground is achieved with a simple structure and thus the ground can be stably achieved.

Further, as in the case of the second embodiment, the slacking or drooping of the film circuit 1 can be prevented by the rigidity which is given to the adhesive sheet 8 by the metal plate 16 serving as the rigid sheet layer 10.

Next, the method of manufacturing the semiconductor device of the third embodiment shown in FIG. 6 will be described.

First, the film circuit 1 having the shape shown in FIGS. 7A and 7B is prepared. FIG. 7A is a plan view of the film circuit 1, and FIG. 7B is a cross-sectional view of the film circuit 1.

The film circuit 1 used in this embodiment has the basically same shape as the film circuit 1 which is used in the first and second embodiments, however, it is different in the following point.

For the leads 3 of the film circuit 1, earth terminals 19 are formed, and element connecting leads 20 to be connected to the electrodes 18 of the semiconductor element 7 and partially earth connecting leads 21 are formed so as to extend from the earth terminals 19. A bump 15 is formed at the tip portion of each lead 20, 21. Here, the earth connecting lead 21 is used for a subsequent electrical connection with the metal plate 16 serving as the rigid sheet layer 10 of the adhesive sheet 8.

Figure 8:
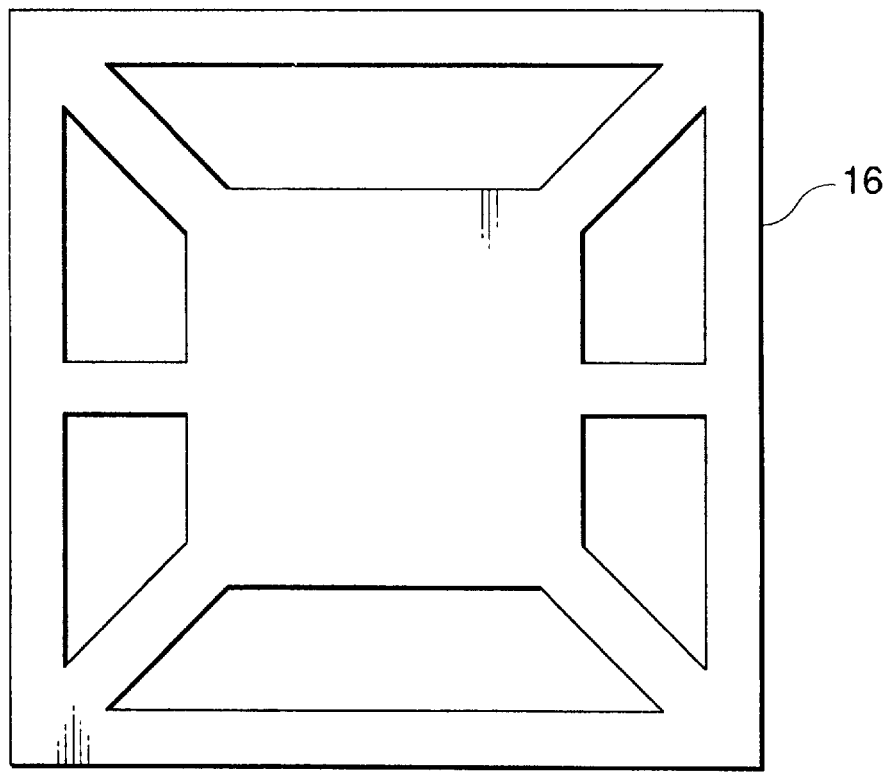
FIG. 8 is a plan view showing the manufacturing method of the third embodiment.
Figure 9:
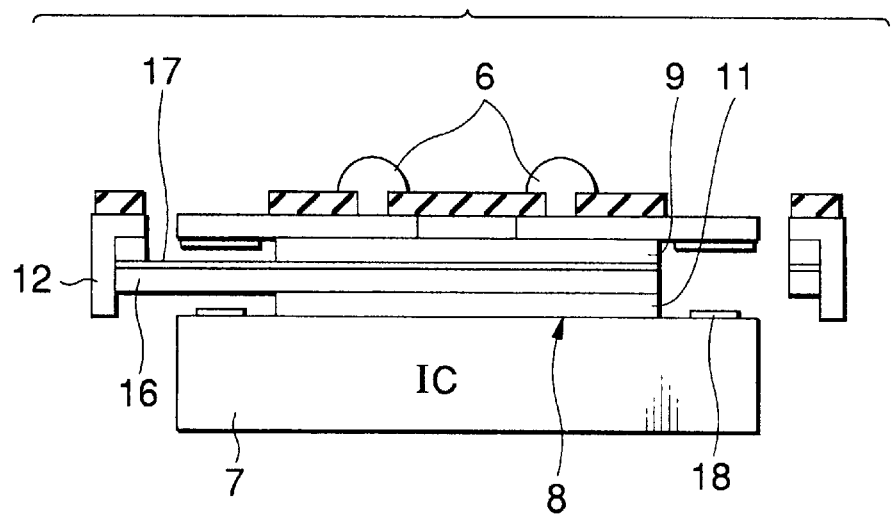
FIG. 9 is a cross-sectional view showing the manufacturing method of the third embodiment.

Subsequently, as shown in FIGS. 8 and 9, the metal plate having rigidity and conductivity such as stainless is used as the rigid sheet layer 10, then a high conductive layer 17 of aluminum, silver or the like is formed on the surface of the metal plate 16 by a plating method, a deposition method or the like, and then an adhesive sheet 8 which is formed by forming cushioning adhesive sheet layers 9, 11 on both the principal planes of the high conductive layer 17 is prepared. The high conductive layer 17 is kept exposed at the peripheral portion of the metal plate 16 of the adhesive sheet 8 (the portion of the lead 3 corresponding to the bump 15). Subsequently, the surface of the semiconductor element 7 is adhesively attached to the back surface of the element facing portion 4 of the film circuit 1 through the adhesive shield 8.

Figure 10A:
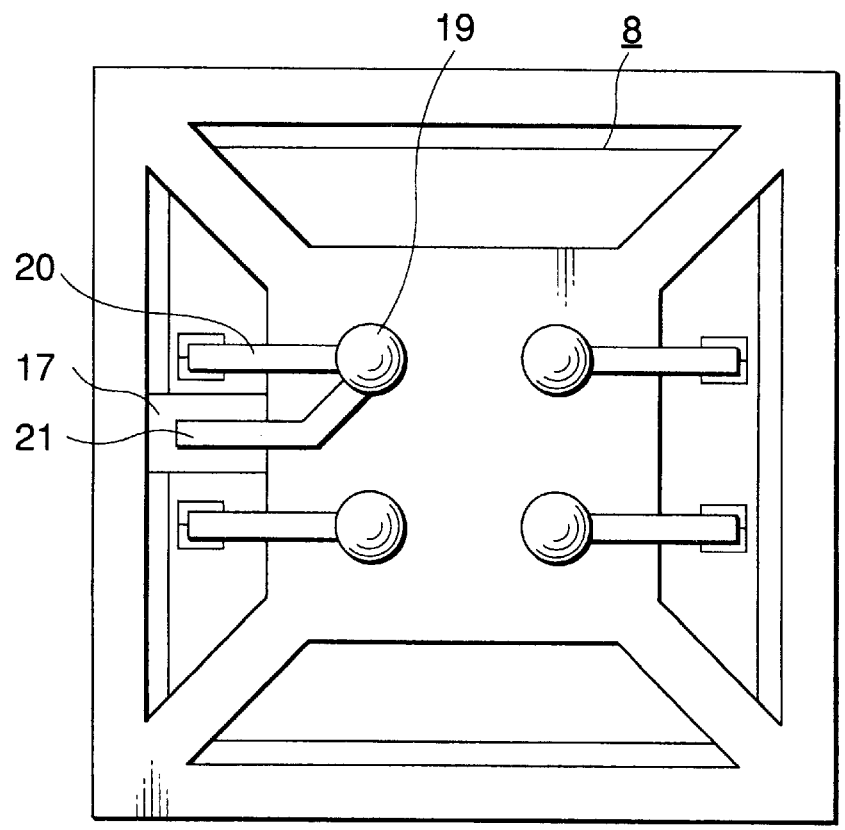
Figure 10B:
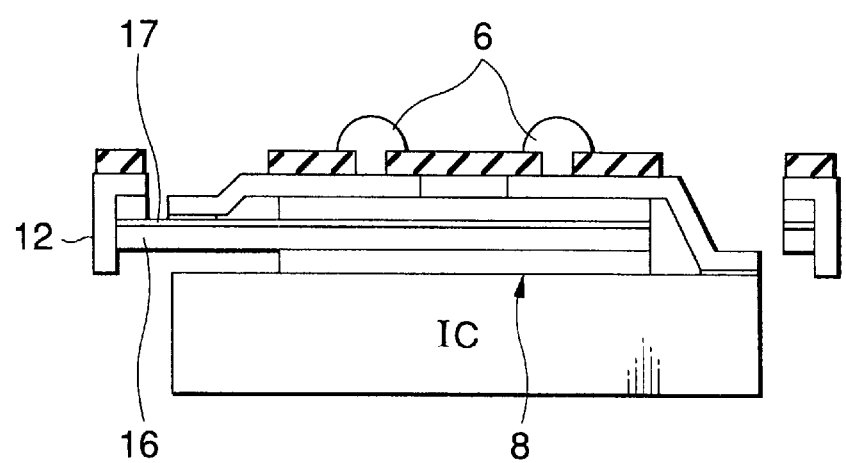

Subsequently, as shown in FIGS. 10A and 10B, the element connecting lead 20 of the film circuit 1 is connected to each electrode 18 of the semiconductor element 7, and at the same time the earth connecting lead 21 of the film circuit 1 is connected to the high conductive layer 17 on the surface of the metal plate 16 serving as the rigid sheet layer 10 of the adhesive sheet 8. That is, the connection step of the electrodes 18 of the semiconductor element 7 and the earth connection step of the film circuit 1 are simultaneously performed in one bonding process by single point bonding or the like, whereby no soldering paste layer 14 used in the second embodiment is needed and the step of filling the soldering paste layer 14 is unnecessary.

Subsequently, the gap between the film circuit 1 and the semiconductor device 7 is sealed with resin 13.

According to the semiconductor device manufacturing method of this embodiment, the connection step of the electrodes 18 of the semiconductor element 7 and the connection step of the earth connection leads 21 of the film circuit 1 to the metal plate 16 can be performed in only one process. Accordingly, the number of steps can be reduced, and the cost can be reduced.

In the first to third embodiments, the adhesive sheet 8 has the three-layer structure as a whole. However, in the outside portion 8b, the cushioning adhesive sheet layer 11 serving as the lowermost layer may be omitted. That is, the outside portion 8b of the adhesive sheet 8 may be designed in a two-layer structure having no cushioning adhesive sheet layer 11.

As described above, the present invention can be made by various embodiments.

Figure 11A:
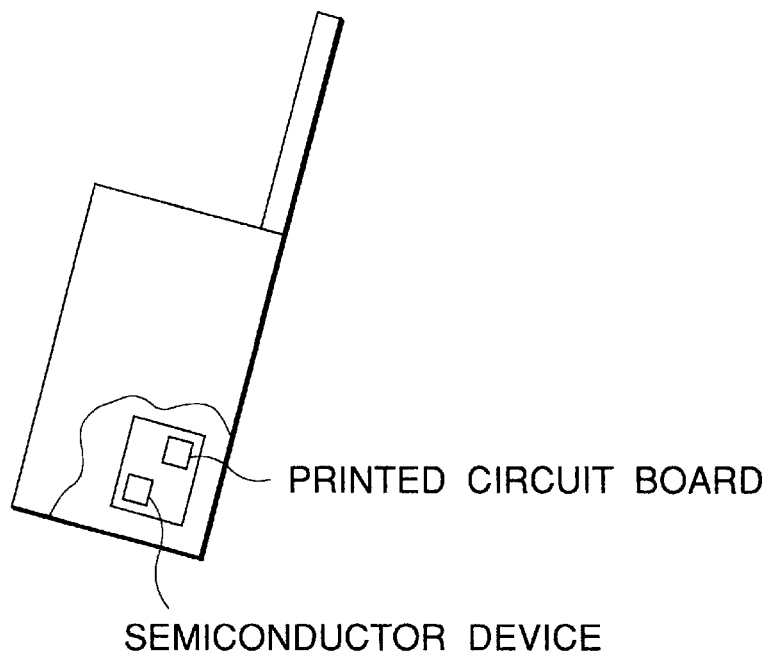
Figure 11B:
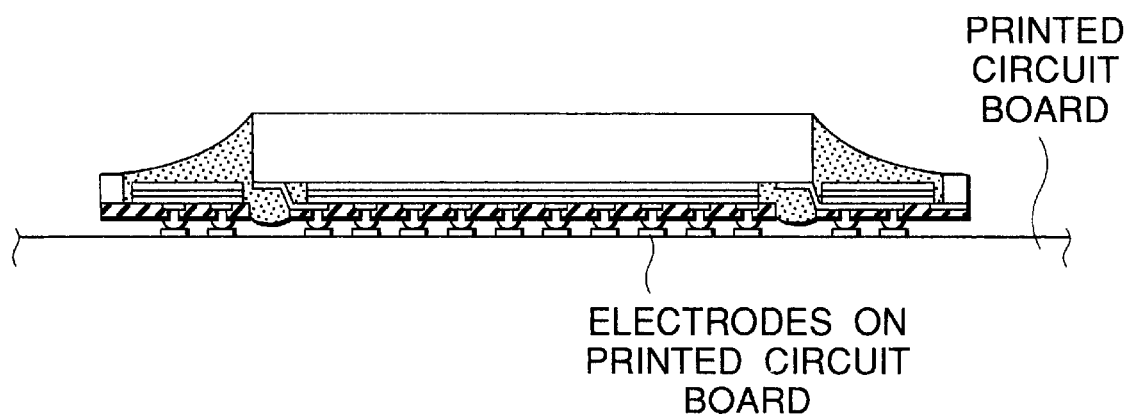

As described above, the semiconductor device can be prevented from sagging or drooping at the peripheral edge portion of the film circuit without using the supporter formed of metal. Therefore, the co-planarity of the external terminals can be enhanced without increasing the weight of the semiconductor device. When the semiconductor device as described above is mounted in electrical equipment such as a portable telephone or the like for which a light design is considered as an important factor as shown in FIGS. 11A and 11B, the electrodes on a printed circuit board in the electrical equipment and the external electrodes of the semiconductor device can be excellently bonded to one another with high reliability, and thus the semiconductor device of the present invention also contributes to further reduce the weight of the electrical equipment.

According to the semiconductor device of the present invention, the sagging of the film circuit, particularly the outside portion thereof can be prevented.

The adhesive sheet has the multilayer structure having the cushioning sheet layer and the rigid sheet layer which are laminated on each other, and the rigid sheet layer is designed to have conductivity and is grounded, whereby the surface portion of the semiconductor element and the outside can be electrostatically intercepted, that is, the electrostatic shield can be achieved. Accordingly, the resistance to high-frequency noises can be enhanced.

Further, the earth connecting lead is formed on the film circuit, and the rigid sheet layer having conductivity is connected to the earth connecting lead, whereby the grounding can be performed with a simple structure. Accordingly, the grounding can be stably performed.

According to the semiconductor device manufacturing method of the present invention, the connection step of the electrodes of the semiconductor element and the earth connecting step of the film circuit can be performed in one step, so that the number of steps can be reduced and the cost can be reduced.

What is claimed is:

1. A semiconductor device comprising a semiconductor element having side terminals along a first surface; a film circuit having a facing portion and an outside portion extending around the facing portion, said film circuit having an insulating base layer with a first surface and a second surface, a plurality of leads being formed on the first surface of the insulating base layer and extending from the facing portion towards the outside portion; and adhesive sheet being interposed between the second surface of the insulating base layer and the first surface of the semiconductor element for joining the film circuit to said semiconductor element, said leads being connected to the terminals of the semiconductor element, a gap between the film circuit and the semiconductor element being sealed and said adhesive sheet having a portion which has rigidity to prevent drooping of the film circuit.

2. A semiconductor device according to claim 1, wherein the adhesive sheet is a multi-layer structure having a cushioning sheet and a rigid sheet laminated to one another.

3. A semiconductor device according to claim 2, which includes a metal ring adjacent to the outer portion of the film circuit being connected to ground, and the rigid sheet being an electrically conductive layer electrically connected to the metal rim.

4. A semiconductor device according to claim 3, wherein the rigid sheet is connected to a lead for an earth connection which is formed on said film circuit.

5. A semiconductor device according to claim 1, wherein the adhesive sheet has a rigid sheet layer comprising an electrically conducted plate.

6. An electrical equipment comprising a printed circuit board;

a semiconductor device comprising a semiconductor element having side terminals on a first surface; a film circuit having a facing portion surrounded by an outer portion, said film circuit including an insulating base layer having a first surface and a second surface, a plurality of leads being formed on the first surface in the facing portion and extending towards the outer portion, said leads adjacent the outer portion being connected to side terminals of the semiconductor element and in the face portion having external terminals electrically connected to electrodes on the printed circuit board, an adhesive sheet interposed between the second surface of the insulating base layer and the first surface of the semiconductor element, said adhesive layer having a multi-layer structure including a cushioning sheet and a rigid sheet laminated together so that the outer portion of said film circuit will not sag.

7. An electrical equipment according to claim 6, wherein the rigid sheet is interposed between a pair of cushioning sheets.

8. An electrical equipment according to claim 6, wherein the rigid sheet is electrically conductive sheet connected to a metal ring surrounded the semiconductor element and being connected to ground.

* * * * *